US010405424B2

(12) United States Patent
Tatsumi

(10) Patent No.: US 10,405,424 B2
(45) Date of Patent: Sep. 3, 2019

(54) DRIVER CIRCUIT FOR OPTICAL TRANSMITTER

(71) Applicant: SUMITOMO ELECTRIC INDUSTRIES, LTD., Osaka (JP)

(72) Inventor: Taizo Tatsumi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/826,332

(22) Filed: Nov. 29, 2017

(65) Prior Publication Data
US 2018/0160532 A1 Jun. 7, 2018

(30) Foreign Application Priority Data
Dec. 1, 2016 (JP) .................................. 2016-234209

(51) Int. Cl.
| | |
|---|---|
| H04B 10/00 | (2013.01) |
| H03F 3/21 | (2006.01) |
| H03F 3/45 | (2006.01) |
| H03F 3/193 | (2006.01) |
| H05K 1/11 | (2006.01) |
| H01S 5/042 | (2006.01) |
| H05K 1/02 | (2006.01) |
| H05K 1/03 | (2006.01) |
| H05K 3/46 | (2006.01) |

(52) U.S. Cl.
CPC .............. *H05K 1/11* (2013.01); *H01S 5/0427* (2013.01); *H05K 1/0245* (2013.01); *H05K 1/024* (2013.01); *H05K 1/0298* (2013.01); *H05K 1/0306* (2013.01); *H05K 3/4629* (2013.01); *H05K 2201/09036* (2013.01)

(58) Field of Classification Search
CPC ........... H04B 10/00; H04B 10/04; H03F 3/21; H03F 3/45; H03F 3/193
USPC ................ 361/760; 330/195, 255, 276, 307; 398/115, 201
See application file for complete search history.

(56) References Cited

U.S. PATENT DOCUMENTS

| | | | | |
|---|---|---|---|---|
| 4,459,457 A | * | 7/1984 | Jurek ..................... | B23K 11/24 219/110 |
| 9,857,821 B2 | * | 1/2018 | Kurs ....................... | G05F 1/625 |

(Continued)

*Primary Examiner* — Xiaoliang Chen
(74) *Attorney, Agent, or Firm* — Smith, Gambrell & Russell, LLP

(57) ABSTRACT

A driver circuit includes: a multilayer board; a differential amplifier; inductor elements; power supply electrodes; and transmission lines, one of which includes a first connection portion electrically connected to one of the power supply electrodes through one of the inductor elements, and another of which includes a second connection portion electrically connected to another of the power supply electrodes through another of the inductor elements, one end of the one transmission line being electrically connected to one output terminal, one end of the other transmission line being electrically connected to another output terminal. The multilayer board includes a first recessed portion between the first connection portion and the second connection portion, a second recessed portion between the first connection portion and the one of the power supply electrodes, and a third recessed portion between the second connection portion and the another of the power supply electrodes.

16 Claims, 6 Drawing Sheets

(56) References Cited

U.S. PATENT DOCUMENTS

2007/0140698 A1* 6/2007 Pan ..................... H03F 3/189
                                                        398/115
2013/0300505 A1* 11/2013 Kondo ................ H03F 1/0272
                                                        330/255

* cited by examiner

DRIVER CIRCUIT FOR OPTICAL TRANSMITTER

TECHNICAL FIELD

An aspect of the present invention relates to a driver circuit for an optical transmitter.

BACKGROUND

Recently, with an increase in transmission rate and an increase in capacity of a communication network in the field of optical communications, there is demand for a decrease in power consumption, an increase in speed, and a decrease in size of a driver circuit for an optical transmitter. A driver circuit for an optical transmitter is a circuit that drives a light emitting device such as a laser diode or an optical modulator. Such a driver circuit has, for example, a configuration described in U.S. Patent Application, Publication No. 2007/0140698. Specifically, the driver circuit includes a differential circuit having two complementary inputs and two complementary outputs. The driver circuit is configured so that a DC bias is supplied to the two complementary outputs of the differential circuit via inductors and a modulated signal is output from the two complementary outputs via capacitors.

SUMMARY

According to an aspect of the invention, there is provided a driver circuit for an optical transmitter, including: a multilayer board; a differential circuit mounted on the multilayer board, including a pair of input terminals for receiving a differential signal and a pair of output terminals for outputting an amplified differential signal; a pair of inductor elements having a first end and a second end; two power supply electrodes formed on the multilayer board, supplying a bias to the pair of output terminals; and a pair of transmission lines formed on the multilayer board, one of the pair of transmission lines having a first connection portion electrically connected to one of the two power supply electrodes through one of the pair of inductor elements, and another of the pair of transmission lines having a second connection portion electrically connected to another of the two power supply electrodes through another of the pair of inductor elements, one end of the one of the pair of transmission lines being electrically connected to one of the pair of output terminals, one end of the another of the pair of transmission lines being electrically connected to another of the pair of output terminals, wherein the multilayer board includes a first recessed portion between the first connection portion and the second connection portion, a second recessed portion between the first connection portion and the one of the two power supply electrodes, and a third recessed portion between the second connection portion and the another of the two power supply electrodes.

DETAILED DESCRIPTION

Hereinafter, an embodiment of a driver circuit for an optical transmitter according to an aspect of the invention will be described in detail with reference to the accompanying drawings. In description with reference to the drawings, the same elements will be referenced by the same reference signs and description thereof will not be repeated.
<Configuration of Driver Circuit for Optical Transmitter>

First, a configuration of a driver circuit for an optical transmitter according to an embodiment will be described below.

Figure 1:
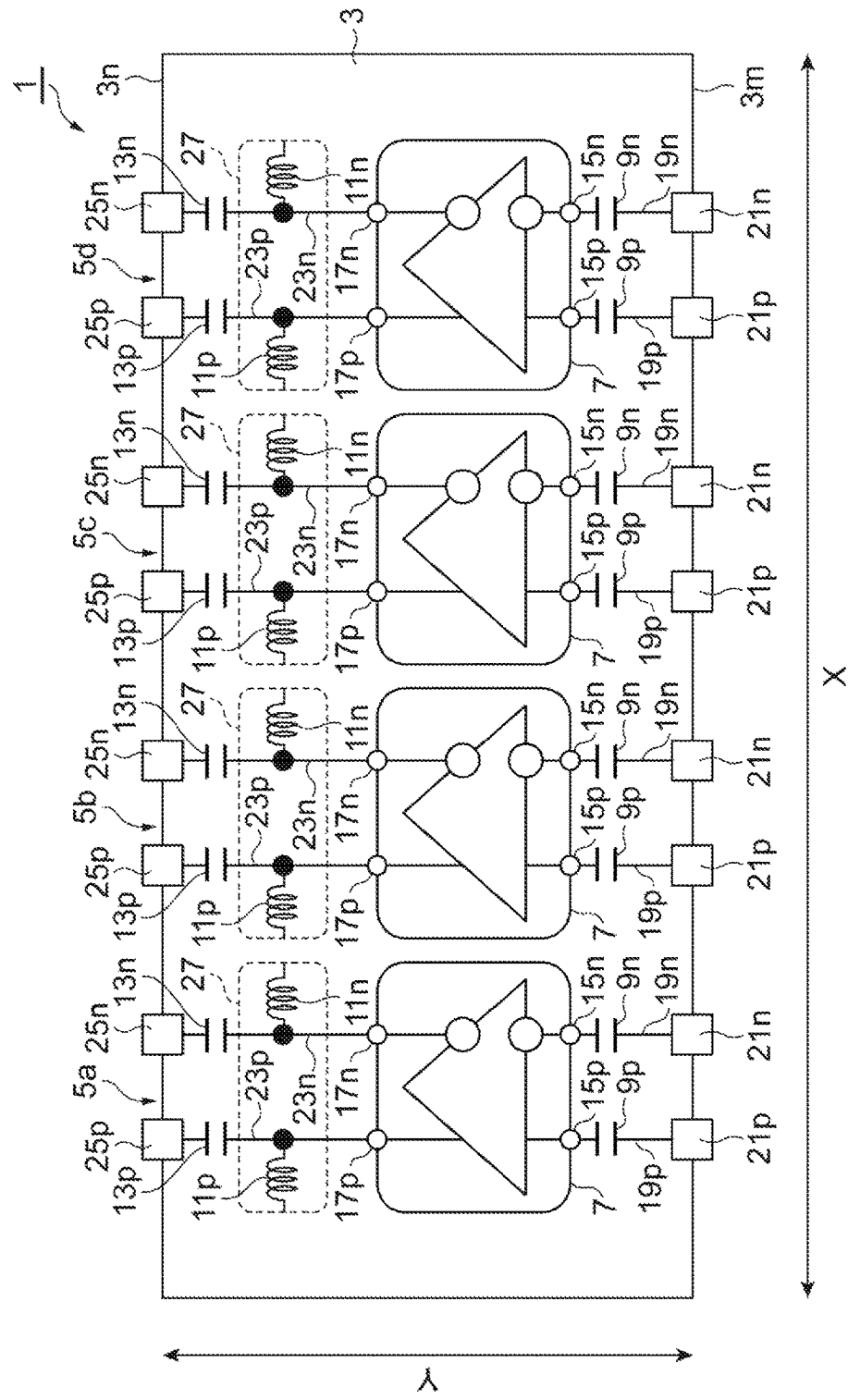
FIG. 1 is a circuit diagram schematically illustrating a configuration of a driver circuit 1 for an optical transmitter according to an embodiment of an aspect.

FIG. 1 is a circuit diagram schematically illustrating a configuration of a driver circuit 1 for an optical transmitter. In the drawing, arrangement states and connection states of circuit components on a circuit board are denoted by circuit symbols. The driver circuit 1 includes four driver systems. Each driver system is used to transmit an independent signal. The independent signal is also referred to as a channel. That is, the driver circuit 1 includes four channels of driver systems. The four channels of driver systems are formed in a single circuit board. The driver systems operate in parallel, that is, separately and concurrently. Each driver system generates drive signals for performing modulation at a modulation rate of 14 Gbuad to 32 Gbaud. The driver circuit 1 is not limited to the configuration of four channels and may include an arbitrary number of channels of driver systems as long as there are two or more channels. The driver circuit 1 is formed in a circuit board 3 which is a ceramic circuit board having a substantially rectangular shape. The circuit board 3 may be a multilayer printed board in which a dielectric material other than a ceramic is used for an insulating layer, or the like. The driver circuit 1 includes a plurality of driver systems 5a, 5b, 5c, and 5d which are formed in the circuit board 3.

The driver system 5a includes a differential amplifier 7, capacitors 9p and 9n, pull-up inductors (a pair of inductor elements) 11p and 11n, and capacitors 13p and 13n. The differential amplifier 7 includes two differential input terminals 15p and 15n and two differential output terminals 17p and 17n. The differential amplifier 7 generates two output signals which are complementary (which have phases reverse to each other) on the basis of two complementary (reverse-phase) input signals input from the two differential input terminals 15p and 15n, and outputs the output signals from the two differential output terminals 17p and 17n. Here, "complementary" refers to, for example, a state in which one (a negative-phase signal) of two signals decreases when the other (an positive-phase signal) of the two signals increases and one of the two signals increases when the other of the two signals decreases. When two signals are complementary and one signal has a maximum value (a peak value), the other signal has a minimum value (a bottom value), and when one signal has a minimum value (a bottom value), the other signal has a maximum value (a peak value). The differential amplifier 7 amplifies two input signals and outputs two input signals which have been amplified as two output signals. The amplitude of the two output signals, for example a difference in voltage between the two output signals, is greater than the amplitude of the two input signals, for example a difference in voltage between the two input signals, due to the amplification. A ratio of the amplitude of the output signal to the amplitude of the input signal depends on a gain of the differential amplifier 7. Differential input is a term which is used when two complementary input signals (a positive-phase signal and a negative-phase signal) are handled as a set (a pair), and differential output is similarly a term which is used when two complementary output signals are handled as a set (a pair).

The differential input terminal 15p of the differential amplifier 7 is electrically connected to an input terminal 21p which is formed at one edge of the circuit board 3 via the capacitor 9p and a strip line (a pair of line portions) 19p formed on the circuit board 3. The differential input terminal 15n of the differential amplifier 7 is electrically connected to an input terminal 21n which is formed at one edge of the circuit board 3 via the capacitor 9n and another strip line (a pair of line portions) 19n formed on the circuit board 3. The capacitors 9p and 9n block a DC component of each input signal and allow passage of high-frequency components of the input signal. A minimum frequency (a cutoff frequency) of an input signal which is transmittable by the capacitors 9p and 9n depends on capacitance values thereof. The differential input terminal 15p and the capacitor 9p may be connected via another strip line than the strip line 19p. The differential input terminal 15n and the capacitor 9n may be connected via another strip line than the strip line 19n.

The differential output terminal 17p of the differential amplifier 7 is electrically connected to the output terminal 25p formed at the other edge of the circuit board 3 via a strip line (a pair of line portions) 23p which is formed on the circuit board 3 and the capacitor 13p. The differential output terminal 17n of the differential amplifier 7 is electrically connected to the output terminal 25n formed at the other edge of the circuit board 3 via a strip line (a pair of line portions) 23n which is formed on the circuit board 3 and the capacitor 13n. The capacitors 13p and 13n block a DC component of each input signal and allow passage of high-frequency components of the signal. A minimum frequency (a cutoff frequency) of an input signal which is transmittable by the capacitors 13p and 13n depends on capacitance values thereof. A pull-up inductor portion 27 including two pull-up inductors 11p and 11n is disposed in the middle of the strip lines 23p and 23n on the circuit board 3.

Impedance of the output terminal 25p matches, for example, impedance of a load circuit which is connected to the output terminal 25p. Impedance of the output terminal 25n matches, for example, impedance of a load circuit which is connected to the output terminal 25n. An example of the load circuit is a transmission line, and each impedance of the output terminals 25p and 25n is set to be equal to a characteristic impedance 50Ω of the respective transmission lines. Each impedance of the output terminals 25p and 25n may be set to a value in a range of 25Ω to 75Ω.

In this embodiment, ferrite bead inductors are used as the pull-up inductors 11p and 11n. The capacitors 13p and 13n and the output terminals 25p and 25n may be connected to each other via strip lines other than the strip lines 23p and 23n.

The driver system 5a having the above-mentioned configuration is mounted between an edge 3m on the input terminals 21p and 21n side and an edge 3n on the output terminals 25p and 25n side which is opposite to the edge 3m in the circuit board 3. The two strip lines 19p and 19n are formed to extend substantially parallel to a direction from the edge 3m to the edge 3n on the circuit board 3. Namely, one of the two strip lines 19p has a direction parallel to a direction of the other of the two strip lines 19n. Also, the two strip lines 23p and 23n are formed to extend substantially parallel to the direction from the edge 3m to the edge 3n on the circuit board 3. Namely, one of the two strip lines 23p has a direction parallel to a direction of the other of the two strip lines 23n. Specifically, defining a center line in the direction from the edge 3m to the edge 3n, the driver system 5a includes the differential amplifier 7 including the differential input terminals 15p and 15n that are arranged symmetrically with respect to the center line and the differential output terminals 17p and 17n that are arranged symmetrically with respect to the center line. In addition, a pair of bias circuits that supplies a bias voltage to the differential amplifier 7 is formed in the driver system 5a. One of the bias circuits includes the pull-up inductor 11p and the strip line 23p. The other of the bias circuits includes the pull-up inductor 11n and the strip line 23n. The bias circuits constituting a pair are arranged symmetrically with respect to the center line of the driver system 5a. The driver systems 5b, 5c, and 5d have the same configuration as the driver system 5a and are formed on the circuit board 3 to be arranged at predetermined intervals substantially parallel to the driver system 5a.

The size of the driver circuit 1 is not limited to a specific size, but, for example, a width X of the circuit board 3 in a direction (hereinafter referred to as an "X direction") parallel to the edges 3m and 3n is set to 14 mm and a width Y of the circuit board 3 in a direction (hereinafter referred to as a "Y direction") perpendicular to the edges 3m and 3n is set to 8 mm. Regarding the size of the pull-up inductor portion 27, a width in the X direction is set to 2 mm and a width in the Y direction is set to 0.4 mm to correspond to the size of the circuit board 3. Since power supply electrodes 29p and 29n (described later) at both ends in the X direction of the pull-up inductor portion 27 are set to have the same source voltage, the pull-up inductor portion 27 may be disposed close or electrically connected to the pull-up inductor portion 27 of a neighboring channel in the X direction. The width X of the circuit board 3 may be set depending on the respective sizes and arrangement of the differential amplifier 7, the capacitors 9p and 9n, the pull-up inductors (a pair of inductor elements) 11p and 11n, and the capacitors 13p and 13n. For example, when the size of the differential amplifier 7 is larger than sizes of other elements, the width X of the circuit board 3 may be determined depending on the size of the differential amplifier 7.

Figure 2:
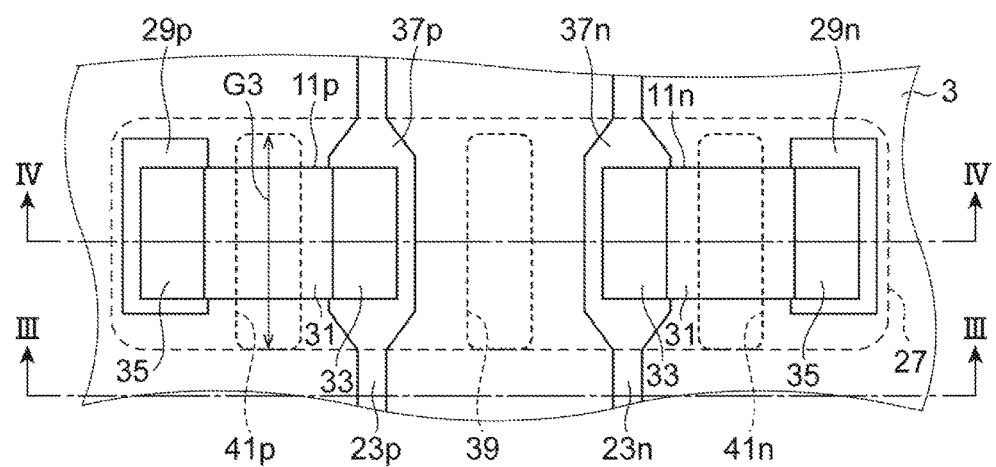
FIG. 2 is a plan view of the vicinity of a pull-up inductor portion 27 of a driver system 5a in FIG. 1.
Figure 3:
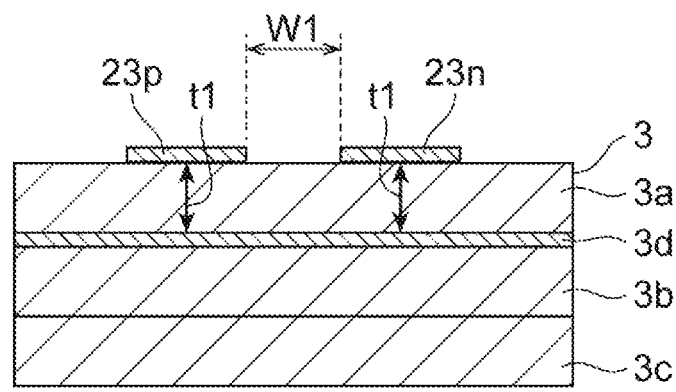
FIG. 3 is a sectional view taken along line III-III in FIG. 2.
Figure 4:
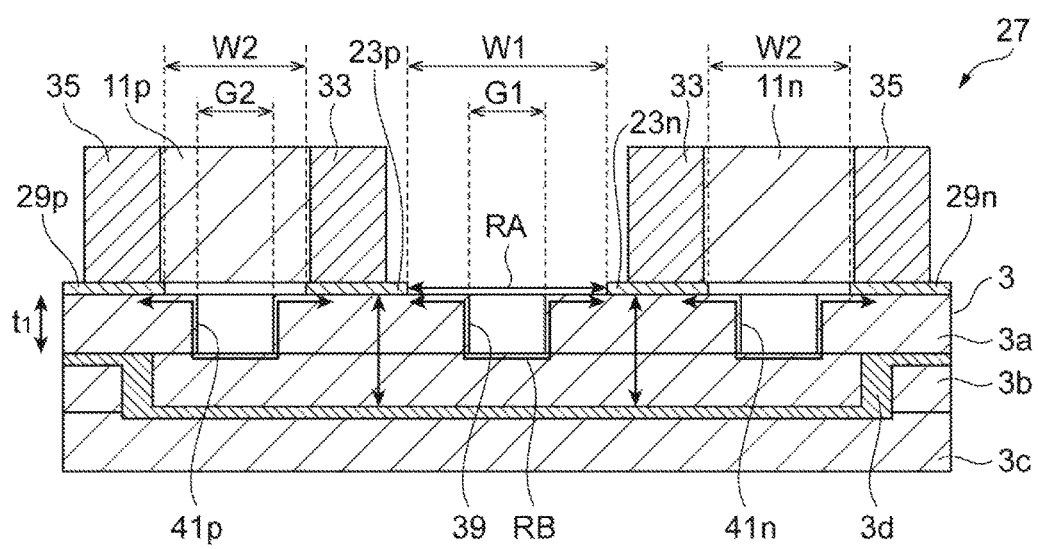
FIG. 4 is a sectional view taken along line IV-IV in FIG. 2.

A structure in the vicinity of the pull-up inductor portion 27 of the driver system 5a will be described below in detail. FIG. 2 is a plan view of the vicinity of the pull-up inductor portion 27 of the driver system 5a, FIG. 3 is a sectional view taken along line III-III in FIG. 2, and FIG. 4 is a sectional view taken along line IV-IV in FIG. 2.

As illustrated in FIG. 2, two strip lines 23p and 23n are formed to extend parallel to each other on the circuit board 3. Outside the two strip lines 23p and 23n on the circuit board 3, the power supply electrode 29p is formed on the strip line 23p side, and the power supply electrode 29n is formed on the strip line 23n side. The power supply electrode 29p supplies a bias voltage to the differential output terminal 17p via the pull-up inductor 11p. The power supply electrode 29n supplies the bias voltage to the differential output terminal 17n via the pull-up inductor 11n.

Each of the pull-up inductors 11p and 11n includes two electrode portions 33 and 35 and a chip portion that is interposed between the electrode portion 33 and the electrode portion 35. The electrode portions 33 and 35 are formed of a metal material. Each of the pull-up inductors 11p and 11n has a substantially rectangular parallelepiped shape. Regarding the size of each of the pull-up inductors 11p and 11n, for example, a width in the X direction (a direction perpendicular to the direction in which the strip lines 23p and 23n extend) is 0.6 mm, and a width in the Y direction (a direction in which the strip lines 23p and 23n extend) is 0.3 mm.

One electrode portion 33 of the pull-up inductor 11p is electrically connected to the strip line 23p by surface contact, and the other electrode portion 35 of the pull-up inductor 11p is electrically connected to the power supply electrode 29p by surface contact. In other words, the electrical connection between the one electrode portion 33 of the pull-up inductor 11p and the strip line 23p has a surface contact therebetween, and the electrical connection between the other electrode portion 35 of the pull-up inductor 11p and the power supply electrode 29p has a surface contact therebetween. One electrode portion 33 of the pull-up inductor 11n is electrically connected to the strip line 23n by surface contact, and the other electrode portion 35 of the pull-up inductor 11n is electrically connected to the power supply electrode 29n by surface contact. In other words, the electrical connection between the one electrode portion 33 of the pull-up inductor 11n and the strip line 23n has a surface contact therebetween, and the electrical connection between the other electrode portion 35 of the pull-up inductor 11n and the power supply electrode 29n has a surface contact therebetween. Here, a connection portion (a first connection portion) 37p for connection to the electrode portion 33 of the pull-up inductor 11p is formed in the strip line 23p. A connection portion (a second connection portion) 37n for connection to the electrode portion 33 of the pull-up inductor 11n is formed in the strip line 23n. In the first connection portion and the second connection portion, a metal layer is exposed from the surface thereof and the first and second connection portions are electrically connected to the electrode portions formed of a metal material by coining into surface contact with the electrode portions. Accordingly, the pull-up inductor 11p is electrically connected between the strip line 23p and the power supply electrode 29p, and the pull-up inductor 11n is electrically connected between the strip line 23n and the power supply electrode 29n.

The electrode portion 33 of the pull-up inductor 11p and the strip line 23p may be more strongly physically and electrically connected to each other by reflow using an appropriate solder material, and the electrode portion 33 of the pull-up inductor 11n and the strip line 23n may be more strongly physically and electrically connected to each other by reflow using an appropriate solder material. With this structure, the pull-up inductor 11p is electrically connected to the differential output terminal 17p via the strip line 23p, and the pull-up inductor 11n is electrically connected to the differential output terminal 17n via the strip line 23n.

As illustrated in FIG. 3, the circuit board 3 has a laminated structure in which three insulating layers 3a, 3b, and 3c formed of a ceramic are laminated. A ground layer 3d which is a grounding metal layer is formed between the first insulating layer 3a and the second insulating layer 3b on the strip lines 23p and 23n side. The third insulating layer 3c of the circuit board 3 is a layer in which a wire for applying another DC bias or the like is formed. For example, a metal layer may be formed between the insulating layer 3b and the insulating layer 3c and may be used as a wire for electrical connection. In a part outside the pull-up inductor portion 27 on the circuit board 3, a distance t1 between each of the strip lines 23p and 23n and the ground layer 3d (the thickness of the insulating layer 3a) is set to, for example, 150 μm. The width in the X direction of the strip lines 23p and 23n is set to, for example, 130 μm to 150 μm and a distance W1 between the two strip lines 23p and 23n is set to, for example, 250 μm to 350 μm. In this case, a pair of strip lines 23p and 23n has, for example, a characteristic impedance of about 100Ω, and also has a ground capacitance with respect to the ground layer 3d and a capacitance generated between the two strip lines.

As illustrated in FIG. 4, in a part corresponding to the pull-up inductor portion 27 on the circuit board 3, the ground layer 3d is formed on a boundary between the second insulating layer 3b and the third insulating layer 3c. That is, in the part corresponding to the pull-up inductor portion 27, the pull-up inductors 11p and 11n and the like are mounted on one surface of the insulating layer 3a, the other surface of the insulating layer 3a is in contact with one surface of the insulating layer 3b, and the ground layer 3d is in contact with the other surface of the insulating layer 3b. For the width in the X direction of a part of the strip lines 23p and 23n, the width inside the pull-up inductor portion 27 is formed to be larger than that of a part outside the portion 27 on the circuit board 3, such that each of the strip lines 23p and 23n covers an area for the surface contact with the respective electrode portions 33 of the pull-up inductors 11p and 11n. That is, the width of broadest parts of the first connection portion 37p and the second connection portion 37n is set to, for example, 200 μm. The distance W2 between the strip line 23p (the first connection portion 37p) and the power supply electrode 29p on the circuit board 3 is set to, for example, 300 μm which is smaller than the length of each chip portion (the interval between the electrode portions 33 and 35 which does not include the electrode portions 33 and 35) of the pull-up inductor 11p. The distance W2 between the strip line 23n (the second connection portion 37n) and the power supply electrode 29n is set to, for example, 300 μm which is smaller than the length of the chip portion (the interval between the electrode portions 33 and 35 which does not include the electrode portions 33 and 35) of the pull-up inductor 11n. The distance W1 between the strip line 23p (the first connection portion 37p) and the strip line 23n (the second connection portion 37n) in the pull-up inductor portion 27 is set to, for example, 300 μm.

As illustrated in FIGS. 2 and 4, between the connection portion 37p of the strip line 23p connected to the pull-up inductor 11p and the connection portion 37n of the strip line 23n connected to the pull-up inductor 11n, a substantially rectangular recessed portion 39 that is recessed downward to the surface on the insulating layer 3a side of the second insulating layer 3b via the first insulating layer 3a is formed in the Y direction (the length direction of the strip lines 23p and 23n). The recessed portion 39 has depth which is substantially equal to thickness of the first insulating layer 3a. In addition, between the first connection portion 37p and the power supply electrode 29p on the circuit board 3, a substantially rectangular recessed portion 41p that is recessed downward to the surface on the insulating layer 3a side of the second insulating layer 3b via the first insulating layer 3a are formed in the Y direction. The recessed portion 41p has depth which is substantially equal to thickness of the first insulating layer 3a. Also, between the second connection portion 37n and the power supply electrode 29n on the circuit board 3, a substantially rectangular recessed portion 41n that is recessed downward to the surface on the insulating layer 3a side of the second insulating layer 3b via the first insulating layer 3a are formed in the Y direction. The recessed portion 41p has depth which is substantially equal to thickness of the first insulating layer 3a. The length G3 in the Y direction of the recessed portions 39, 41p, and 41n is set to correspond to the width in the Y direction of the pull-up inductors 11p and 11n. For example, the length G3 in the Y direction of the recessed portions 39, 41p, and 41n is preferably set to be equal to or greater than 0.8 times the width in the Y direction of the pull-up inductors 11p and 11n. The width G1 in the X direction of the recessed portion 39 is set to, for example, 200 µm to be smaller than the width W1. The width G2 in the X direction of the recessed portions 41p and 41n is set to, for example, 200 µm to be smaller than the width W2. The width G1 in the direction of the recessed portion 39 may be set to be larger than the width G2 in the X direction of the recessed portions 41p and 41n.

The recessed portions 39, 41p, and 41n are formed on the circuit board 3 as follows. That is, in a step of forming via holes and/or IVHs (Interstitial Via Holes) and wiring patterns in a green sheet (a raw ceramic sheet which has not been baked yet) for the first insulating layer 3a in a process of manufacturing a multilayer ceramic circuit board, patterns of the recessed portions 39, 41p, and 41n are punched in the green sheet. Thereafter, by superimposing and baking the green sheet of the insulating layer 3a, the green sheet of the second insulating layer 3b, and the green sheet of the third insulating layer 3c, a circuit board 3 in which hole portions 39, 41p, and 41n penetrating the insulating layer 3a are formed is obtained. Here, description of formation of the ground layer 3d is omitted for the purpose of simplification of description.

According to the above-mentioned driver circuit 1, output signals (differential output) for driving a light emitting device or an optical modulator are generated from the input signals (differential input) input from the two differential input terminals 15p and 15n by the differential amplifier 7, and the generated output signals are output from the two differential output terminals 17p and 17n. Here, the two differential output terminals 17p and 17n are connected to the pull-up inductors 11p and 11n to supply a bias voltage without causing a voltage drop. A current (a bias current) flows from the differential output terminals 17p and 17n of the differential amplifier 7 into the inside of the differential amplifier 7 via the pull-up inductors 11p and 11n. When the bias current flows in the pull-up inductors 11p and 11n, resistance components (equivalent series resistance ESR) of the pull-up inductors 11p and 11n are small and thus the voltage drop of the DC current is sufficiently small or negligible. Accordingly, reduction of the voltage drop in the differential amplifier 7 allows the source voltage to be lowered by as much. A lowered source voltage brings a decrease in power consumption of the driver circuit 1. In addition, on the circuit board 3 on which the differential amplifier 7 and the pull-up inductors 11p and 11n are mounted, the recessed portion 39 is formed between the strip lines 23p and 23n connected to the two differential output terminals 17p and 17n. The recessed portion 41p is formed between the connection portion 37p in the strip line 23p which is electrically connected to one electrode portion 33 of the pull-up inductor 11p and the power supply electrode 29p for supplying a bias voltage which is connected to the other electrode portion 35 of the pull-up inductor 11p. The recessed portion 41n is formed between the connection portion 37n in the strip line 23n which is electrically connected to one electrode portion 33 of the pull-up inductor 11n and the power supply electrode 29n for supplying the bias voltage which is connected to the other electrode portion 35 of the pull-up inductor 11n. Since the specific dielectric constant of air in the recessed portions 39, 41p, and 41n is less than the specific dielectric constant of the insulating layer 3a when the recessed portions 39, 41p, and 41n are not formed, this configuration allows capacitive coupling between the two differential output terminals 17p and 17n to be reduced. As a result, such a lowered capacitive coupling prevents a decrease in differential impedance between the two differential output terminals 17p and 17n. Accordingly, by reducing deterioration of high frequency characteristics of the differential output of the differential amplifier 7 as described above, the driver circuit 1 has an advantage to easily achieve an increase in the number of channels and a decrease in size. For example, an operating frequency band of the driver circuit 1 can reach about 25 GHz or more.

The driver circuit 1 according to this embodiment includes a plurality of differential amplifiers 7 which are mounted on the circuit board 3. Each differential amplifier 7 includes pull-up inductors 11p and 11n, strip lines 23p and 23n, power supply electrodes 29p and 29n, and recessed portions 39, 41p, and 41n on the circuit board 3. The configuration that reduces deterioration of high frequency characteristics of outputs allows the number of channels of the driver circuit to be increased.

The lengths of the recessed portions 39, 41p, and 41n in the length direction (the Y direction) of the strip lines 23p and 23n are set to be equal to or greater than 0.8 times the length of the pull-up inductors 11p and 11n in the Y direction. In this configuration, setting the lengths in the Y direction of the recessed portions 39, 41p, and 41n, which have a specific dielectric constant smaller than that of the insulating layer 3a, to be sufficiently large prevents a decrease in differential impedance between the two differential output terminals 17p and 17n. As a result, deterioration in high frequency characteristics of the differential outputs of the differential amplifier 7 can be reduced.

An advantage of suppressing a decrease in differential impedance between the differential output terminals 17p and 17n in this embodiment may be evaluated in comparison with a comparative example.

Figure 6:
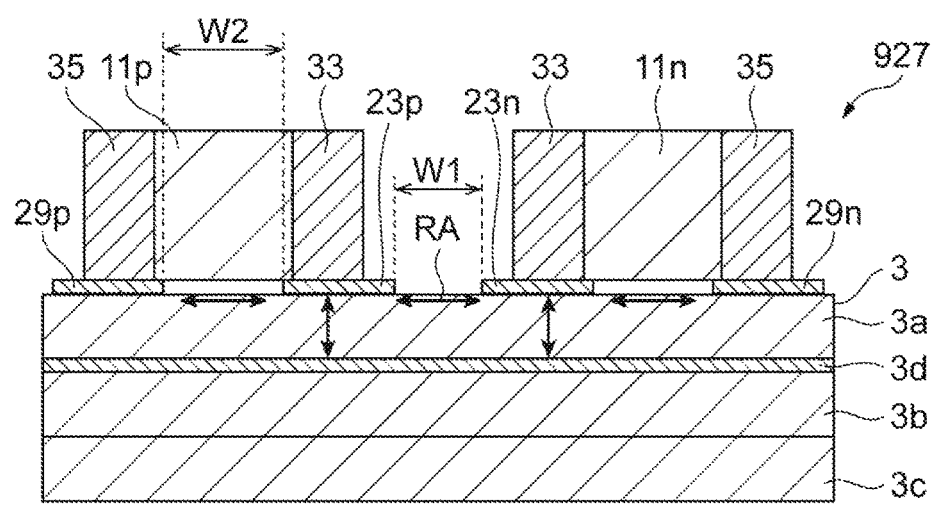
FIG. 6 is a sectional view of a pull-up inductor portion 927 according to a comparative example.

FIG. 6 is a sectional view illustrating a pull-up inductor portion 927 according to a comparative example in the X direction. The configuration of the pull-up inductor portion 927 according to the comparative example is different from the pull-up inductor portion 27, in that the ground layer 3d is disposed between the first insulating layer 3a and the second insulating layer 3b and the recessed portions 39, 41p, and 41n are not formed in the circuit board 3. In the pull-up inductor portion 927 having such a configuration, it is assumed that each of the pull-up inductors 11p and 11n has a parasitic capacitance component of about 40 fF between the electrode portions 33 and 35. Such parasitic capacitance component degrades the differential impedance between the differential output terminals 17p and 17n of the pull-up inductor portion 927 in comparison with the differential impedance of the pull-up inductor portion 27 according to this embodiment.

That is, in the pull-up inductor portion 927, larger capacitance components than in the embodiment are caused between the two strip lines 23p and 23n, between the strip line 23p and the power supply electrode 29p, between the strip line 23n and the power supply electrode 29n, and between each of the strip lines 23p and 23n and the ground layer 3d, respectively. Such an increase in capacitance component causes a decrease in differential impedance between the differential output terminals 17p and 17n. In the pull-up inductor portion 927, a larger distance between the strip line 23p and the power supply electrode 29p and a larger distance W2 between the strip line 23n and the power supply electrode 29n by employing the pull-up inductors 11p and 11n which are long in the X direction may increase the differential impedance. However, an increase in the width in the X direction of the pull-up inductor portion 927 per channel increases hinders decreasing the size of the multichannel driver circuit.

The differential impedance between the differential output terminals 17p and 17n in the pull-up inductor portion 27 according to this embodiment and the pull-up inductor portion 927 according to the comparative example may be evaluated. In order to simplify calculation, the capacitance formed between the two strip lines 23p and 23n is approximated to a capacitance based on a pair of parallel plate electrodes with an area S. The capacitance Q formed by the two strip lines 23p and 23n is calculated by Equation (1).

$$Q = \varepsilon_0 \cdot \varepsilon_r \cdot S/d \qquad (1)$$

In Equation (1), $\varepsilon_0$ denotes a dielectric constant in a vacuum ($\approx 1.0$), $\varepsilon_r$ denotes a specific dielectric constant of a medium between the electrodes, S denotes an area of the electrodes, and d denotes a distance between the electrodes.

Equation (2-1) can be derived From Equation (1).

$$1/Q = A \cdot d/\varepsilon_r \qquad (2-1)$$

Here, coefficient A is a value which is calculated by $A=1/(\varepsilon_0 \cdot S)$ on the assumption that the area S through which an electric field passes between the strip lines 23p and 23n is constant. Capacitance Q927 in a path RA (FIG. 6) in the pull-up inductor portion 927 is calculated by substituting the distance d=W1=300 μm and the specific dielectric constant $\varepsilon_r$=9.0 of the insulating layer 3a into Equation (2-1). On the other hand, the capacitance Q27RA in a path RA (FIG. 4) in the pull-up inductor portion 27 is a capacitance in which a capacitance $Q_2$ of the recessed portion 39 and capacitances $Q_1$ and $Q_3$ outside the recessed portion 39 are connected in series as expressed by Equation (2-2).

$$\begin{aligned} 1/Q27RA &= 1/Q_1 + 1/Q_2 + 1/Q_3 \\ &= A \cdot 2d_1/\varepsilon_{r1} + A \cdot d_2/\varepsilon_{r2} \\ &= A \cdot (2d_1 \cdot \varepsilon_{r2} + d_2 \cdot \varepsilon_{r1})/(\varepsilon_{r1} \cdot \varepsilon_{r2}) \end{aligned} \qquad (2-2)$$

In Equation (2-2), $\varepsilon_{r2}$ denotes a specific dielectric constant of air in the recessed portion 39, $\varepsilon_{r1}$ denotes a specific dielectric constant of the insulating layer 3a on both sides of the recessed portion 39, $d_2$ denotes a width in the X direction of the recessed portion 39, and $d_1$ denotes a distance of a path which passes through the insulating layer 3a on both sides of the recessed portion 39. For example, when $d_1=(1/6) \cdot d$, $d_2=(2/3) \cdot d$, and $\varepsilon_{r1}=\varepsilon_r$ are established, Equation (2-2) is expressed by Equation (2-3).

$$1/Q27RA = (A \cdot d/\varepsilon_r) \cdot \{1/3 + (2/3) \cdot (\varepsilon_r/\varepsilon_{r2})\} \qquad (2-3)$$

When the specific dielectric constant $\varepsilon_r$=9.0 and the specific dielectric constant $\varepsilon_{r2}$=1.0 are substituted therein, Equation (2-3) is expressed by Equation (2-4).

$$1/Q27RA = (A \cdot d/\varepsilon_r) \cdot 6.333 \qquad (2-4)$$

In this way, the value of the capacitance Q27RA which is calculated by Equation (2-4) is about 1/6 times the value of the capacitance Q927=1/(A·d/$\varepsilon_r$) which is calculated by Equation (2-1). Accordingly, the capacitance value between the strip lines 23p and 23n in the pull-up inductor portion 27 can be decreased to be less than the capacitance value in the pull-up inductor portion 927. The capacitance Q27RB in a path RB (FIG. 4) along the side surface and the bottom surface of the recessed portion 39 in the pull-up inductor portion 27 is estimated by Equation (2-5).

$$1/Q27RB = A \cdot (d+2 \cdot t_1)/\varepsilon_r \qquad (2-5)$$

In Equation (2-5), $t_1$ denotes the thickness of the insulating layer 3a. In this way, when the distance $2 \cdot t_1$ in the depth direction of the recessed portion 39 is added to the distance d in the path RB, it can be seen that the value of a capacitance Q39 between the electrodes separated by the path RB is less than the capacitance value which is calculated by Equation (2-1).

For example, when d=300 μm and $t_1$=150 μm are set, $d=2 \cdot t_1$ is satisfied and Equation (2-5) is expressed by Equation (2-6).

$$1/Q27RB = (A \cdot d/\varepsilon_r) \cdot 3 \qquad (2-6)$$

From Equation (2-4) and Equation (2-6), the capacitance Q27RB in the path RB is equal to or greater than two times the capacitance Q27RA in the path RA. Therefore, it is assumed that the capacitance in the path RA may be ignored at the time of estimation of the capacitance between the strip lines 23p and 23n. Accordingly, in the configuration of the pull-up inductor portion 27, the capacitance can be decreased to the same capacitance as in the configuration in which the distance between the strip lines 23p and 23n in the pull-up inductor portion 927 is increased to (W1+2·$t_1$). Accordingly, the configuration of the pull-up inductor portion 27 in this embodiment allows the characteristic impedance of the strip lines 23p and 23n to be increased to a value equivalent to that in a case in which the channel width has been increased without actually increasing the channel width. For example, when the thickness is $t_1$=150 μm, the same advantages as in a case in which the channel width is increased by $2 \cdot t_1 \cdot 3$=900 μm is obtained by providing three recessed portions 39, 41p, and 41n. That is, the pull-up inductor portion 27 in this embodiment can suppress the capacitance between two strip lines 23p and 23n to the same extent as the value in the case of the pull-up inductor portion 927 in the comparative example even when the width in the X direction is decreased by 900 μm. Due to the advantage of decreasing the capacitance, the width in the X direction of the driver circuit 1 as a whole including fourth channels of driver systems 5a to 5d can be decreased by 3.6 mm.

Figure 5:
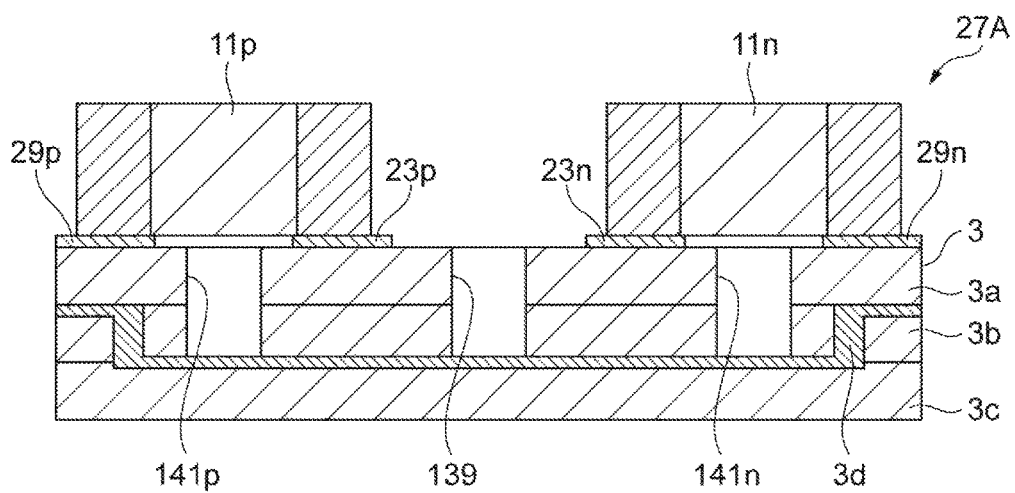
FIG. 5 is a sectional view of a pull-up inductor portion 27A according to a modified example.

While the principle of the invention has been illustrated and described in an exemplary embodiment, it will be understood by those skilled in the art that the driver circuit according to an aspect of the invention can modified in arrangements and details without departing from the principle. The driver circuit according to an aspect of the invention is not limited to specific configurations disclosed in the embodiment. Accordingly, the scope of the driver circuit according to an aspect of the invention includes all corrections and modifications based on the appended claims and the spirit thereof. For example, FIG. 5 illustrates a sectional structure in the X direction of a pull-up inductor portion 27A according to a modified example of the embodiment. In this modified example, the three recessed portions 139, 141p, and 141n formed on the circuit board 3 are recessed downward to the surface of the third insulating layer 3c on the insulating layer 3a side via the first insulating layer 3a and the second insulating layer 3b. The depth of the first to third recessed portions is substantially equal to a sum of a thickness of the first insulating layer and a thickness of the second insulating layer. Such a configuration with recessed portions having a larger depth allows the capacitance between the strip lines 23p and 23n to be reduced without increasing the width in the X direction of the pull-up inductor portion 27A. The recessed portions 139, 141p, and 141n are formed as follows. That is, in a step of forming via holes and/or IVHs (Interstitial Via Holes) and wiring patterns in a green sheet for the first insulating layer 3a in a process of manufacturing a multilayer ceramic circuit board, patterns of the recessed portions 139, 141p, and 141n are punched in the green sheet. Similarly, in a step of forming via holes and/or IVHs (Interstitial Via Holes) and wiring patterns in a green sheet for the second insulating layer 3b, patterns of the recessed portions 139, 141p, and 141n are also punched in the green sheet. Thereafter, by superimposing and baking the green sheet of the insulating layer 3a, the green sheet of the second insulating layer 3b, and the green sheet of the third insulating layer 3c, a circuit board 3 in which recessed portions 139, 141p, and 141n penetrating the insulating layer 3a and the insulating layer 3b are formed is obtained. Here, description of formation of the ground layer 3d is omitted for the purpose of simplification of description.

What is claimed is:

1. A driver circuit for an optical transmitter, comprising:
a multilayer board;
a differential circuit mounted on the multilayer board, and including a pair of input terminals for receiving a differential signal and a pair of output terminals for outputting an amplified differential signal;
a pair of inductor elements each having a first end and a second end;
two power supply electrodes formed on the multilayer board, and supplying a bias to the pair of output terminals; and
a pair of transmission lines formed on the multilayer board, one of the pair of transmission lines having a first connection portion electrically connected to one of the two power supply electrodes through one of the pair of inductor elements, and another of the pair of transmission lines having a second connection portion electrically connected to another of the two power supply electrodes through another of the pair of inductor elements, one end of the one of the pair of transmission lines being electrically connected to one of the pair of output terminals, one end of the another of the pair of transmission lines being electrically connected to another of the pair of output terminals,
wherein the multilayer board includes a first recessed portion between the first connection portion and the second connection portion, a second recessed portion between the first connection portion and the one of the two power supply electrodes, and a third recessed portion between the second connection portion and the another of the two power supply electrodes.

2. The driver circuit according to claim 1, wherein the one of the pair of transmission lines has a direction parallel to a direction of the another of the pair of transmission lines on the multilayer board.

3. The driver circuit according to claim 1, wherein each inductor element has a chip portion and two electrode portions separately formed at both ends of the chip portion, and
wherein the two electrode portions of one of the pair of inductor elements has a first electrical connection between one of the two electrode portions thereof and the one of the pair of transmission lines, and a second electrical connection between another of the two electrode portions thereof and the one of the two power supply electrodes.

4. The driver circuit according to claim 3, wherein the first electrical connection includes a first surface contact between the one of the two electrode portions thereof and the one of the pair of transmission lines, and
wherein the second electrical connection includes a second surface contact between the another of the two electrode portions thereof and the one of the two power supply electrodes.

5. The driver circuit according to claim 1, wherein the multilayer board has a laminated structure that includes a first insulating layer, a second insulating layer under the first insulating layer, and a third insulating layer under the second insulating layer, and has a metal layer formed between the second insulating layer and the third insulating layer,
wherein the two power supply electrodes and the pair of transmission lines are formed on the first insulating layer, and
wherein the first to third recessed portions have a depth equal to or greater than a thickness of the first insulating layer.

6. The driver circuit according to claim 5, wherein the metal layer is electrically connected to ground.

7. The driver circuit for an optical transmitter according to claim 5, wherein the depth of the first to third recessed portions is substantially equal to a sum of the thickness of the first insulating layer and a thickness of the second insulating layer.

8. The driver circuit according to claim 1, wherein the second recessed portion has a width in a length direction of the pair of transmission lines, the width is equal to or greater than 0.8 times a width of the one of the pair of inductor elements in the length direction, and
wherein the third recessed portion has a width in the length direction, the width of the third recessed portion is equal to or greater than 0.8 times a width of the another of the pair of inductor elements in the length direction.

9. The driver circuit according to claim 8, wherein the first recessed portion has a width in the length direction, the width of the first recessed portion is equal to or greater than the width of the second recessed portion in the length direction or equal to or greater than the width of the third recessed portion in the length direction.

10. The driver circuit according to claim 1, wherein the multilayer board includes a first insulating layer having a first side on which the pair of inductor elements are mounted and a second side opposite to the first side, a second insulating layer having a first side in surface contact with the second side of the first insulating layer and a second side opposite to the first side of the second insulating layer, and a metal layer in surface contact with the second side of the second insulating layer, and
wherein the first recessed portion, the second recessed portion, and the third recessed portion have a depth substantially equal to a thickness of the first insulating layer.

11. The driver circuit according to claim 10, wherein the first insulating layer and the second insulating layer include a ceramic material.

12. The driver circuit according to claim 11, wherein the first recessed portion, the second recessed portion, and the third recessed portion have a dielectric constant less than a dielectric constant of the ceramic material.

13. The driver circuit according to claim 1, wherein the multilayer board includes a first insulating layer having a first side on which the pair of inductor elements is mounted and a second side opposite to the first side, a second insulating layer having a first side in surface contact with the second side of the first insulating layer and a second side opposite to the first side of the second insulating layer, a third insulating layer having a first side in surface contact with the second side of the second insulating layer, and a metal layer formed between the second insulating layer and the third insulating layer, and wherein the first recessed portion, the second recessed portion, and the third recessed portion have a depth substantially equal to a sum of a thickness of the first insulating layer and a thickness of the second insulating layer.

14. The driver circuit according to claim 13, wherein the first insulating layer, the second insulating layer, and the third insulating layer include a ceramic material.

15. The driver circuit according to claim 14, wherein the first recessed portion, the second recessed portion, and the third recessed portion have a dielectric constant less than a dielectric constant of the ceramic material.

16. An integrated driver circuit comprising:

a plurality of driver systems each including the driver circuit according to claim 1, the driver systems being arranged parallel to each other on the multilayer board, wherein the plurality of driver systems includes an electrical connection between one of the two power supply electrodes of one of plurality of driver systems and one of the two power supply electrodes of another of the plurality of driver systems, and the another of the plurality of driver systems is next to the one of the plurality of driver systems.

\* \* \* \* \*